(12) United States Patent
Kim

(10) Patent No.: US 7,943,508 B2
(45) Date of Patent: May 17, 2011

(54) FABRICATING METHOD OF A SEMICONDUCTOR DEVICE

(75) Inventor: Kwang Jean Kim, Gapyeong-gun (KR)

(73) Assignee: Dongbu Hitek Co., Ltd., Seoul (KR)

( * ) Notice: Subject to any disclaimer, the term of this patent is extended or adjusted under 35 U.S.C. 154(b) by 821 days.

(21) Appl. No.: 11/929,978

(22) Filed: Oct. 30, 2007

(65) Prior Publication Data
US 2008/0153297 A1    Jun. 26, 2008

(30) Foreign Application Priority Data

Dec. 21, 2006 (KR) ................. 10-2006-0131493

(51) Int. Cl.
*H01L 21/4763* (2006.01)
(52) U.S. Cl. .......... 438/637; 438/638; 438/666
(58) Field of Classification Search .......... 438/629, 438/637, 638, 639, 666, 672
See application file for complete search history.

(56) References Cited

U.S. PATENT DOCUMENTS

| | | | | |
|---|---|---|---|---|
| 5,614,765 A | * | 3/1997 | Avanzino et al. | 257/774 |
| 5,741,626 A | * | 4/1998 | Jain et al. | 430/314 |
| 6,245,665 B1 | * | 6/2001 | Yokoyama | 438/623 |
| 6,284,645 B1 | * | 9/2001 | Lai et al. | 438/624 |
| 6,514,857 B1 | * | 2/2003 | Naik et al. | 438/638 |
| 6,887,784 B1 | * | 5/2005 | Blosse | 438/638 |
| 6,972,259 B2 | * | 12/2005 | Wang et al. | 438/694 |
| 7,183,202 B2 | * | 2/2007 | Lee et al. | 438/638 |

* cited by examiner

*Primary Examiner* — Kevin M Picardat
(74) *Attorney, Agent, or Firm* — Saliwanchik, Lloyd & Eisenschenk

(57) ABSTRACT

Disclosed is a method of fabricating a semiconductor device, in which the process steps of a photoresist process for forming a metal line are simply reduced, and a process exerting an influence on the contact hole is minimized, so that the electrical characteristics of the semiconductor device can be improved. A reactive ion etching process is repeatedly performed, so that the depth of the trench or the aspect ratio of the contact hole can be adjusted. In addition, the region, in which the lower metal interconnection and the contact hole make contact with each other, can be cleaned.

12 Claims, 4 Drawing Sheets

FABRICATING METHOD OF A SEMICONDUCTOR DEVICE

CROSS-REFERENCE TO RELATED APPLICATION

The present application claims the benefit under 35 U.S.C. §119 of Korean Patent Application No. 10-2006-0131493, filed Dec. 21, 2006, which is hereby incorporated by reference in its entirety.

BACKGROUND

Recently, semiconductor devices have become highly-integrated and are being operated at high speed. Accordingly, the size of the transistors in semiconductor devices has become gradually reduced. As the integration degree of the transistors increases, a metal line of the semiconductor device is fabricated in a micro size. As a result, signals applied to the metal line may become delayed or distorted and thus the high-speed operation of the semiconductor device is interrupted.

In order to solve such a problem, a metal line using copper has been rapidly developed. The copper line is used because the copper line has lower resistance and higher electro-migration resistance characteristics as compared with those of aluminum or an aluminum alloy widely used as the metal line material of semiconductor devices.

In order to form a copper line, a copper layer is formed and then must be etched. However, different from aluminum, copper is not easily etched and the surface of a copper layer is rapidly oxidized in an atmosphere. Accordingly, a damascene process has been developed in order to solve such a problem when forming a copper line.

However, in such a damascene process, a contact hole having a micro-size is sensitive even to a small factor, and is easily damaged. In addition, the photoresist (NOVOLAC) typically used for filling the contact hole may cause defects to the contact hole.

Thus, there exists a need in the art for an improved method of fabricating a semiconductor device.

BRIEF SUMMARY

Embodiments of the present invention provide methods of fabricating a semiconductor device in which the process steps of a photoresist process when forming a metal line are simply reduced. According to embodiments of the present invention, processes that adversely exert an influence on the contact hole are minimized, so that the electrical characteristics of the semiconductor device can be improved.

A method of fabricating a semiconductor device according to a first embodiment comprises sequentially forming a first interlayer dielectric layer and a second interlayer dielectric layer on a base interlayer dielectric layer having a metal interconnection, forming a first photoresist pattern on the second interlayer dielectric layer for forming a trench, forming a dummy trench by etching the second interlayer dielectric layer using the first photoresist pattern as an etching mask, filling the dummy trench with an insulating layer identical to the first interlayer dielectric layer, forming a second photoresist pattern on the insulating layer so as to form a contact hole, forming the contact hole by etching the insulating layer and the first interlayer dielectric layer using the second photoresist pattern as an etching mask, removing the second photoresist pattern, and then repeatedly etching the insulating layer and the first interlayer dielectric layer to form a trench.

A method of fabricating a semiconductor device according to a second embodiment comprises sequentially forming a first interlayer dielectric layer and a second interlayer dielectric layer on a base interlayer dielectric layer having a metal interconnection, forming a first photoresist pattern on the second interlayer dielectric layer for forming a trench, forming a dummy trench by etching the second interlayer dielectric layer using the first photoresist pattern as an etching mask, filling the dummy trench with an insulating layer identical to the first interlayer dielectric layer, forming a second photoresist pattern on the insulating layer so as to form a contact hole, forming a partial contact hole by etching the insulating layer and the first interlayer dielectric layer using the second photoresist pattern as an etching mask, removing the second photoresist pattern, and then repeatedly etching the insulating layer and the first interlayer dielectric layer to form the contact hole and a trench.

DETAILED DESCRIPTION

Figure 1:
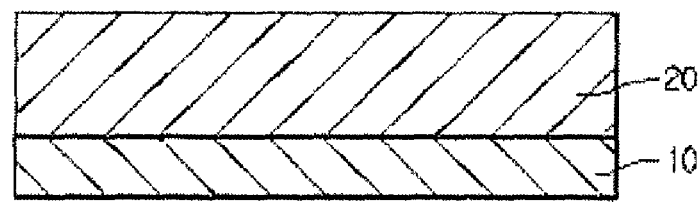
FIGS. 1 to 8 are views representing a process of fabricating a semiconductor device according to an embodiment of the present invention.

Hereinafter, embodiments will be described in detail with reference to the accompanying drawings. First, it should be noted that, similar elements or parts have been designated by the same reference numerals in the drawings. In the description of the embodiments, the detailed description of related known functions or configurations will be omitted herein to avoid making the subject matter of the described embodiments ambiguous.

Further, when the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present. Thus, the meaning thereof should be determined based on the scope of the present invention.

Referring to FIG. 1, a first interlayer dielectric layer 10 and a second interlayer dielectric layer 20 can be sequentially formed on a base interlayer dielectric layer (not shown) having a lower metal interconnection. In this case, the first and second interlayer dielectric layers 10 and 20 have a great difference in etching selectivity ratio in a Reactive Ion Etching (RIE). According to embodiments, the etching selectivity ratio of between the first and second interlayer dielectric layers 10 and 20 is above 100. The etching selectivity ratio means that in one second, one layer is etched about 1 µm when the other of two layers is etched about 100 µm.

Figure 2:
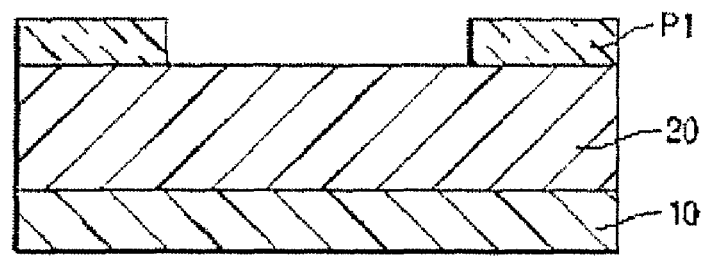

Referring to FIG. 2, a photoresist film can be coated on the second interlayer dielectric layer 20. Then, the photoresist film is exposed and developed to form a first photoresist pattern P1 for forming a trench.

Figure 3:
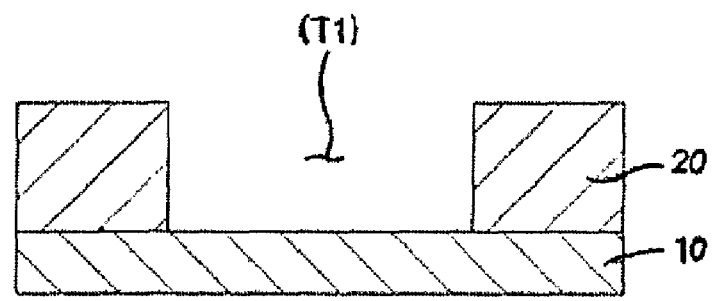

Referring to FIG. 3, the second interlayer dielectric layer 20 can be etched using the first photoresist pattern P1 as an etching mask to form a dummy trench T1. The second interlayer dielectric layer 20 can be etched through a dry etching process, such as RIE. In one embodiment, a RIE using oxygen gas can be performed. Here, the first and second interlayer dielectric layers 10 and 20 have a great difference in etching selectivity ratio, such as about 100, so that the second interlayer dielectric layer 20 is etched to form the dummy trench T1.

Figure 4:
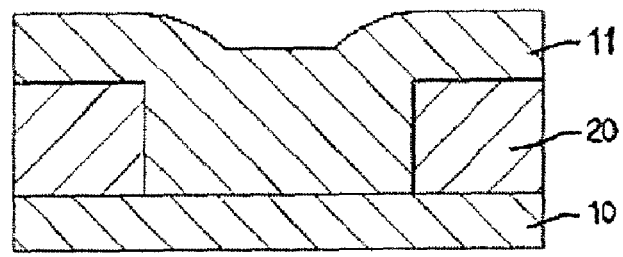
Figure 5:
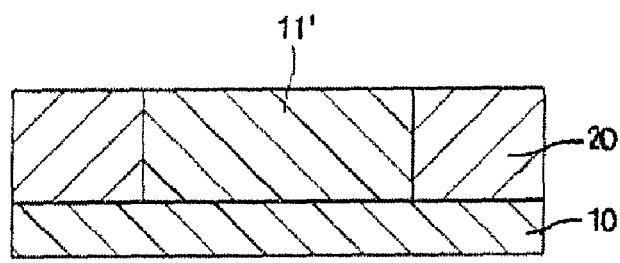

Subsequently, the first photoresist pattern P1 is removed by an ashing process, and then the substrate can be cleaned. Referring to FIGS. 4 and 5, an insulating layer 11, which is similar or identical to the material of the first interlayer dielectric layer 10 provided under the second interlayer dielectric layer 20, can be formed on the second interlayer dielectric layer 20 having the dummy trench T1 so as to fill the dummy trench T1. Then, the insulating layer 11 on regions other than the dummy trench T1 is removed. Accordingly, the insulating layer 11' exists only on the first interlayer dielectric layer 10, and can have a height identical to that of the second interlayer dielectric layer 20. A chemical mechanical polishing CMP process can be performed to remove the insulating layer 11 from the regions other than the dummy trench T1, so that the resultant structure is planarized.

Figure 6:
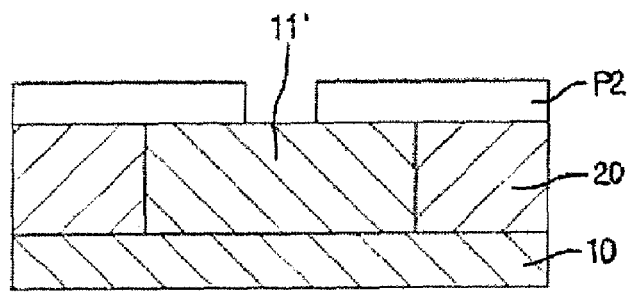

Then, referring to FIG. 6, a second photoresist film (not shown) can be coated on the second interlayer dielectric layer 20 having the dummy trench T1 and the interlayer dielectric layer 11' filled in the dummy trench T1. And then, the second photoresist film can be exposed and developed to form a second photoresist pattern P2 for forming a contact hole on the insulating layer 11'.

Figure 7:
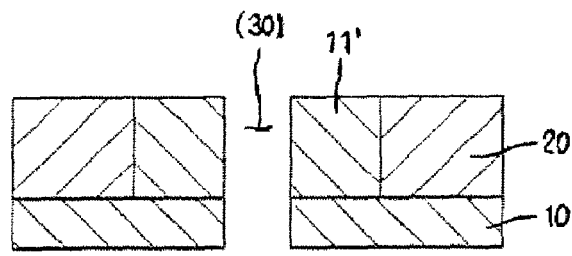

Referring to FIG. 7, the insulating layer 11' and the first interlayer dielectric layer 10 are etched using the second photoresist pattern P2 as an etching mask to form the contact hole 30. At this time, the etching method can include a dry etching process, such as RIE. For example, the RIE using oxygen gas can be performed.

Figure 8:
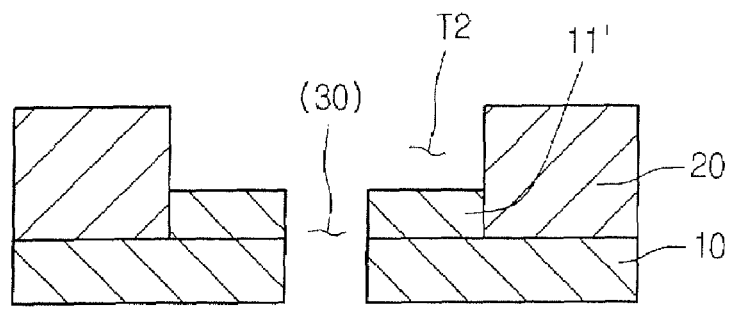

Subsequently, the second photoresist pattern P2 is removed by the ashing process, and the substrate can be cleaned. Referring to FIG. 8, the RIE using oxygen gas can be performed again relative to the insulating layer 11' having the contact hole 30 to form a trench T2.

Figure 9:
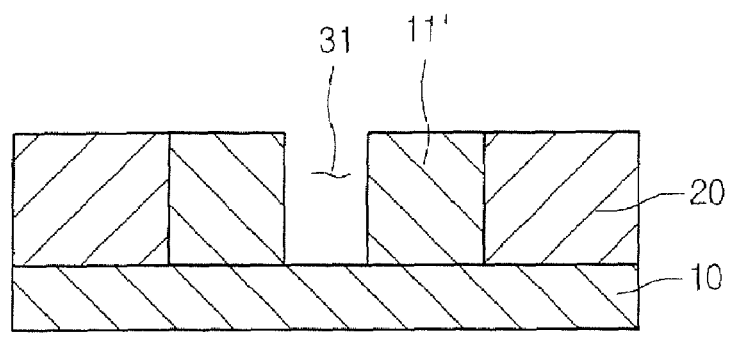
FIGS. 9 to 10 are views representing a process of fabricating a semiconductor device according to another embodiment of the present invention.
Figure 10:
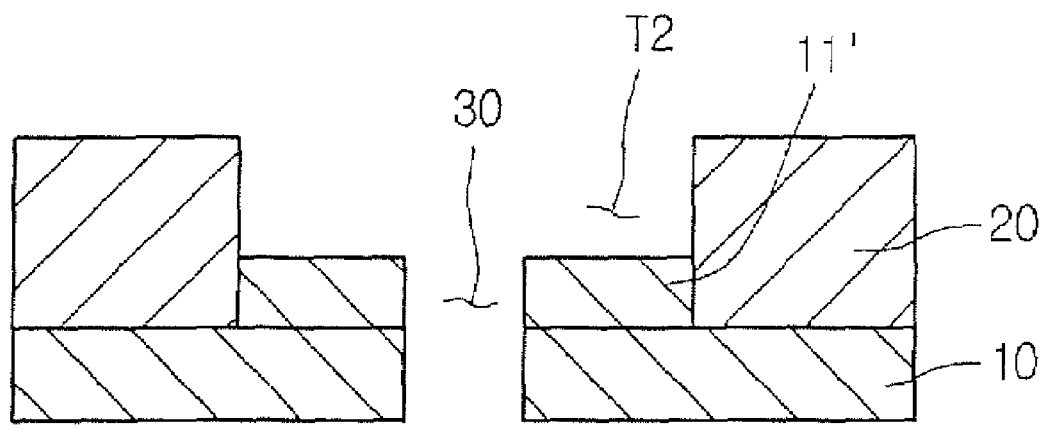

FIGS. 9 and 10 are views illustrating a process of manufacturing a semiconductor device according to a second embodiment. The processes for the method of manufacturing the semiconductor device according to the second embodiment are substantially identical to those of the method according to the first embodiment as shown in FIGS. 1 to 6. Accordingly, the detailed description of elements having the same functions as those in the first embodiment will be omitted in order to avoid redundancy, and the same names and the same reference numerals will be assigned to the same or similar elements.

Referring to FIG. 9, after forming the insulating layer 11' in the dummy trench T1 and the second photoresist pattern on the insulating layer 11', the insulating layer 11' can be etched using the second photoresist pattern as an etching mask to form a partial contact 31. At this time, the etching method can includes a dry etching process, such as RIE. For example, the RIE using oxygen gas can be performed. After forming the partial contact 31, the second photoresist pattern can be removed through an ashing process, and the substrate can be cleaned.

Then, referring to FIG. 10, the RIE using oxygen gas can be repeatedly performed relative to the insulating layer 11' having the partial contact 31 to form a contact hole 30 and a trench T2.

In the method of manufacturing the semiconductor device according to the first and second embodiments, the second interlayer dielectric layer has a great difference in etching selectivity relative to the insulating layer 11', and the second interlayer dielectric layer is not etched by the RIE process even if the etching mask is not provided.

In addition, the RIE process can be repeatedly performed, so that a depth of the trench or an aspect ratio of the contact hole can be adjusted. In addition, a region, in which the lower metal interconnection makes contact with the contact hole, can be cleaned.

While the method of manufacturing the semiconductor device according to the embodiments has been described with reference to accompanying drawings, it will be apparent to those skilled in the art that the method is not limited to the preferred embodiments and the drawings, and various modifications and variations can be made in the present invention. Thus it is intended that the present invention covers the modifications and the variations of this invention provided they come with within the scope of the appended claims and their equivalents.

According to the method of manufacturing the semiconductor device of the embodiments having the above configuration, the process steps of the photoresist process are simply reduced, and the process exerting an influence on the contact hole is minimized, so that the electrical characteristics of the semiconductor device are improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, comprising:
   sequentially forming a first interlayer dielectric layer and a second interlayer dielectric layer on a base interlayer dielectric layer having a metal interconnection;
   forming a first photoresist pattern for forming a trench on the second interlayer dielectric layer;
   forming a dummy trench by etching the second interlayer dielectric layer using the first photoresist pattern as an etching mask;

filling the dummy trench with an insulating layer similar to the material of the first interlayer dielectric layer;

forming a second photoresist pattern for forming a contact hole on the insulating layer;

forming the contact hole by etching the insulating layer and the first interlayer dielectric layer using the second photoresist pattern as an etching mask;

removing the second photoresist pattern; and etching the insulating layer to form a trench without using a third photoresist pattern.

2. The method according to claim 1, wherein an etching selectivity ratio between the first interlayer dielectric layer and the second interlayer dielectric layer is above 100.

3. The method according to claim 1, wherein forming the dummy trench by etching the second interlayer dielectric layer comprises performing a reactive ion etching process.

4. The method according to claim 3, wherein the reactive ion etching process is performed using oxygen gas.

5. The method according to claim 1, wherein etching the insulating layer and the first interlayer dielectric layer to form the contact hole and the trench comprises performing a reactive ion etching process.

6. The method according to claim 5, wherein the reactive ion etching process is performed using oxygen gas.

7. A method of manufacturing a semiconductor device, comprising:

sequentially forming a first interlayer dielectric layer and a second interlayer dielectric layer on a base interlayer dielectric layer having a metal interconnection;

forming a first photoresist pattern for forming a trench on the second interlayer dielectric layer;

forming a dummy trench by etching the second interlayer dielectric layer using the first photoresist pattern as an etching mask;

filling the dummy trench with an insulating layer similar to the material of the first interlayer dielectric layer;

forming a second photoresist pattern for forming a contact hole on the insulating layer;

forming a partial contact by etching at least a portion of the insulating layer using the second photoresist pattern as an etching mask;

removing the second photoresist pattern; and etching the insulating layer and the first interlayer dielectric layer to form the contact hole and a trench without using a third photoresist pattern.

8. The method according to claim 7, wherein an etching selectivity ratio between the first interlayer dielectric layer and the second interlayer dielectric layer is above 100.

9. The method according to claim 7, wherein forming the dummy trench by etching the second interlayer dielectric layer comprises performing a reactive ion etching process.

10. The method according to claim 9, wherein the reactive ion etching process is performed using oxygen gas.

11. The method according to claim 7, wherein etching the insulating layer and the first interlayer dielectric layer to form the contact hole and the trench comprises performing a reactive ion etching process.

12. The method according to claim 11, wherein the reactive ion etching process is performed using oxygen gas.

* * * * *